United States Patent
Satoh et al.

(10) Patent No.: US 7,981,710 B2
(45) Date of Patent: Jul. 19, 2011

(54) LIGHT EMITTING DEVICE AND MANUFACTURING METHOD

(75) Inventors: Eiichi Satoh, Osaka (JP); Shogo Nasu, Hyogo (JP); Reiko Taniguchi, Osaka (JP); Masayuki Ono, Osaka (JP); Masaru Odagiri, Hyogo (JP)

(73) Assignee: Panasonic Corporation, Osaka (JP)

( * ) Notice: Subject to any disclaimer, the term of this patent is extended or adjusted under 35 U.S.C. 154(b) by 543 days.

(21) Appl. No.: 12/058,242

(22) Filed: Mar. 28, 2008

(65) Prior Publication Data

US 2008/0237628 A1    Oct. 2, 2008

(30) Foreign Application Priority Data

Mar. 30, 2007 (JP) ................. 2007-091946
Mar. 30, 2007 (JP) ................. 2007-091954

(51) Int. Cl.
*H01L 21/00* (2006.01)

(52) U.S. Cl. ............... 438/46; 257/12; 257/13; 257/14; 257/15; 257/16; 257/17; 257/18; 257/E33.025

(58) Field of Classification Search .............. 438/46; 257/E33.025, 12–18
See application file for complete search history.

(56) References Cited

U.S. PATENT DOCUMENTS 6,639,354 B1 * 10/2003 Kojima et al. ............... 313/498
2006/0091789 A1 * 5/2006 Aoyama et al. ............. 313/502
2007/0069202 A1   3/2007 Choi et al.
2007/0159073 A1   7/2007 Sakanoue et al.

FOREIGN PATENT DOCUMENTS

| JP | 2001-210865 | 8/2001 |
| JP | 2006-127884 | 5/2006 |
| JP | 2007-95685  | 4/2007 |
| JP | 2007-194194 | 8/2007 |

* cited by examiner

*Primary Examiner* — Lynne A Gurley
*Assistant Examiner* — Hsin-Yi (Steven) Hsieh
(74) *Attorney, Agent, or Firm* — McDermott Will & Emery LLP

(57) ABSTRACT

A light emitting device of the invention includes an electron transporting layer, a hole transporting layer provided mutually facing the electron transporting layer with a distance between the hole transporting layer and the electron transporting layer, a phosphor layer having a layer of a plurality of semiconductor fine particles sandwiched between the electron transporting layer and the hole transporting layer, a first electrode provided facing the electron transporting layer and connected electrically, and a second electrode provided facing the hole transporting layer and connected electrically: in which the semiconductor fine particles composing the phosphor layer have a p-type part and an n-type part inside of the particles and have a pn-junction in the interface of the p-type part and the n-type part and are arranged in a manner that the p type part is partially brought into contact with the hole transporting layer and at the same time, the n type part is partially brought into contact with the electron transporting layer.

3 Claims, 14 Drawing Sheets

LIGHT EMITTING DEVICE AND MANUFACTURING METHOD

This application claims priority based on Japanese Patent Application No. 2007-91946 filed in Japan on Mar. 30, 2007, and Japanese Patent Application No. 2007-91954 filed in Japan on Mar. 30, 2007, the disclosure of which are incorporated herein by references.

BACKGROUND OF THE INVENTION

1. Field of the Invention

The invention relates to a light emitting device and a method for manufacturing thereof.

2. Description of the Related Art

In recent years, researches and investigations on light emitting devices operated by d.c. current have actively been made. Particularly, Group III nitride compound semiconductors represented by gallium nitride (GaN), indium gallium nitride mixed crystal (InGaN), aluminum gallium nitride mixed crystal (AlGaN), and indium aluminum gallium nitride mixed crystal (InAlGaN) have been attracting attention as practical semiconductor materials to be used for light emitting devices such as blue-LED (blue light emitting diode) and UV-LED (ultraviolet light emitting diode).

Conventionally, such Group III nitride compound semiconductors have been formed in single crystal thin films by growing on substrates by MOCVD method (Metal Organic Chemical Vapor Deposition).

However, in the case a light emitting device is manufactured by the MOCVD method, it is required that a substrate to be used has a crystal lattice constant approximately equal to that of a compound semiconductor to be grown thereon and is excellent in heat resistance. That is, there is a problem that the material quality and the size of the substrate are limited.

For example, in the case a Group III nitride compound semiconductor is to be grown, a crystalline sapphire ($\alpha$—$Al_2O_3$) substrate is mainly employed. The sapphire has a crystal lattice constant approximately same as that of a Group III nitride compound semiconductor, particularly, gallium nitride and is excellent in heat resistance and therefore a preferable material as a substrate for MOCVD. However, in the case of using the sapphire substrate, since it is required to carry out the growth on the c-plane thereof, the processability and formability of the substrate are difficult and thus there is a problem of a high material cost.

Further, since it is difficult to form a thin film with a uniform thickness on the entire face of a substrate, a substrate with a large surface area cannot be used and the size is presently about 20 cm×20 cm at maximum and thus there is a problem of low productivity.

Furthermore, since a light emitting device has a multilayer structure made of a phosphor layer (also referred to as an active layer) and an electron/hole carrier transporting layer, it is required to grow a compound semiconductor on a bonding plane of respective semiconductor layers by epitaxial growth without causing crystal lattice strains. The reason is that crystal lattice defects such as dislocation in the periphery of the bonding plane of the respective semiconductor layers are generated and a light emitting efficiency is lowered if crystal lattice strains are caused. That is, it is required to precisely control the crystal systems of the respective semiconductor layers and the lattice constants and it is extremely difficult to set the crystal growth conditions and control the conditions and thus there is a problem of difficulty in manufacture.

Therefore, to materialize a light emitting device capable of carrying out surface light emission, it is tried to perform a method of enabling surface light emission by sandwiching a particle layer in which particles are bonded by calcining between a hole transporting layer and an electron transporting layer and applying voltage between the hole transporting layer and the electron transporting layer. For example, refer to JP-A No. 2001-210865.

However, it is required to bond particles by calcining in a method for manufacturing a light emitting device as described in Patent Document 1 and in the configuration of the light emitting device obtained by the method, therefore there occurs a problem that the method cannot be employed in the case of using a material with a low vapor pressure or a sublimation material such as GaN. Further, since there are voids among particles, the structure is easy to cause current leakage.

SUMMARY OF THE INVENTION

Therefore, to solve the above-mentioned problems, the object of the invention is to provide a light emitting device capable of carrying out surface light emission with a large surface area and suppressing power consumption due to current leakage, and a method for manufacturing thereof.

A light emitting device of the invention includes an electron transporting layer, a hole transporting layer provided mutually facing the electron transporting layer with a distance between the hole transporting layer and the electron transporting layer, a phosphor layer having a layer of a plurality of semiconductor fine particles sandwiched between the electron transporting layer and the hole transporting layer, a first electrode provided facing the electron transporting layer and connected electrically, and a second electrode provided facing the hole transporting layer and connected electrically, wherein each semiconductor fine particle included in the phosphor layer has a p-type part and an n-type part inside of the particles, and each semiconductor fine particle has a pn-junction in the interface of the p-type part and the n-type part, wherein the semiconductor fine particles are arranged in such a manner that the p type part of each semiconductor fine particle is partially brought into contact with the hole transporting layer, and the n type part of each semiconductor fine particle is partially brought into contact with the electron transporting layer.

Further, the phosphor layer may have a single particle layer of the semiconductor fine particles. The semiconductor fine particles are arranged over the layer by one particle in depth direction. The phosphor layer may further include a dielectric material filling the voids among the semiconductor fine particles.

Furthermore, the average particle diameter of the semiconductor fine particles is preferable to be larger than the average distance between the electron transporting layer and the hole transporting layer.

Furthermore, the semiconductor particles may include GaN fine-crystals. The semiconductor fine particles may have an average particle diameter ranging from 1 μm to 100 μm.

A method for manufacturing a light emitting device according to the invention includes:

forming a first electron transporting layer on a substrate;

forming a second electron transporting layer having fluidity on the first electron transporting layer;

forming a single particle layer of semiconductor fine particles on the second electron transporting layer by arranging by one semiconductor fine particle in depth direction;

forming a pn-junction in each semiconductor fine particle;

forming a hole transporting layer on the single particle layer; and forming a second electrode on the hole transporting layer.

The method may further include the steps of embedding a dielectric material in voids among the semiconductor fine particles and removing the dielectric material to expose upper parts of the semiconductor fine particles.

Further, as the semiconductor fine particles, semiconductor fine particles including GaN may be used.

Furthermore, a light emitting device according to the invention includes:

an electron transporting layer;

a hole transporting layer provided mutually facing the electron transporting layer with a distance between the hole transporting layer and the electron transporting layer;

a phosphor layer having a layer of a plurality of semiconductor fine particles sandwiched between the electron transporting layer and the hole transporting layer, wherein the semiconductor fine particles are stored one by one in a groove provided on at least one opposed surface of the electron transporting layer or the hole transporting layer facing each other;

a first electrode provided facing the electron transporting layer and connected electrically; and a second electrode provided facing the hole transporting layer and connected electrically.

Further, each semiconductor fine particle included in the phosphor layer may have a p-type part and an n-type part inside of the particle, and each semiconductor fine particle has a pn-junction in the interface of the p-type part and the n-type part. In this case, the semiconductor fine particles are arranged in such a manner that the p type part of each semiconductor fine particle may be partially brought into contact with the hole transporting layer, and the n type part of each semiconductor fine particle may be partially brought into contact with the electron transporting layer.

Further, the phosphor layer may have a single particle layer of the semiconductor fine particles. The semiconductor fine particles may be arranged over the layer by one particle in depth direction. The phosphor layer may further include a dielectric material filling the voids among the semiconductor fine particles.

Furthermore, the distances of the wall parts composing the groove are preferable to be larger than the average particle diameter of the semiconductor fine particles.

The height of the wall parts composing the groove is preferable to be smaller than the average particle diameter of the semiconductor fine particles.

Furthermore, the semiconductor particles may include GaN fine-crystals. The semiconductor fine particles may have an average particle diameter ranging from 1 µm to 100 µm.

A method for manufacturing the light emitting device according to the invention includes:

forming a first electron transporting layer on a substrate;

forming a groove part on the surface of the first electron transporting layer;

forming a second electron transporting layer having fluidity in the bottom of the groove part on the first electron transporting layer;

forming a single particle layer of semiconductor fine particles on the first electron transporting layer by arranging semiconductor fine particles one by one in each groove part;

forming a hole transporting layer on the single particle layer; and forming a second electrode on the hole transporting layer.

The method may further include forming pn-junction in each semiconductor fine particle.

The method may furthermore include embedding a dielectric material in voids among the semiconductor fine particles and removing the dielectric material to expose upper parts of the semiconductor fine particles.

Further, as the semiconductor fine particles, semiconductor fine particles including GaN may be used.

According to the invention, it is made possible to manufacture a light emitting device capable of carrying out surface light emission with a large surface area at a low cost.

BRIEF DESCRIPTION OF THE DRAWINGS

Various objects, features and advantages of the invention will be apparent from the following preferable embodiments with reference to the appended drawings.

PREFERRED EMBODIMENT OF THE PRESENT INVENTION

Figure 1:
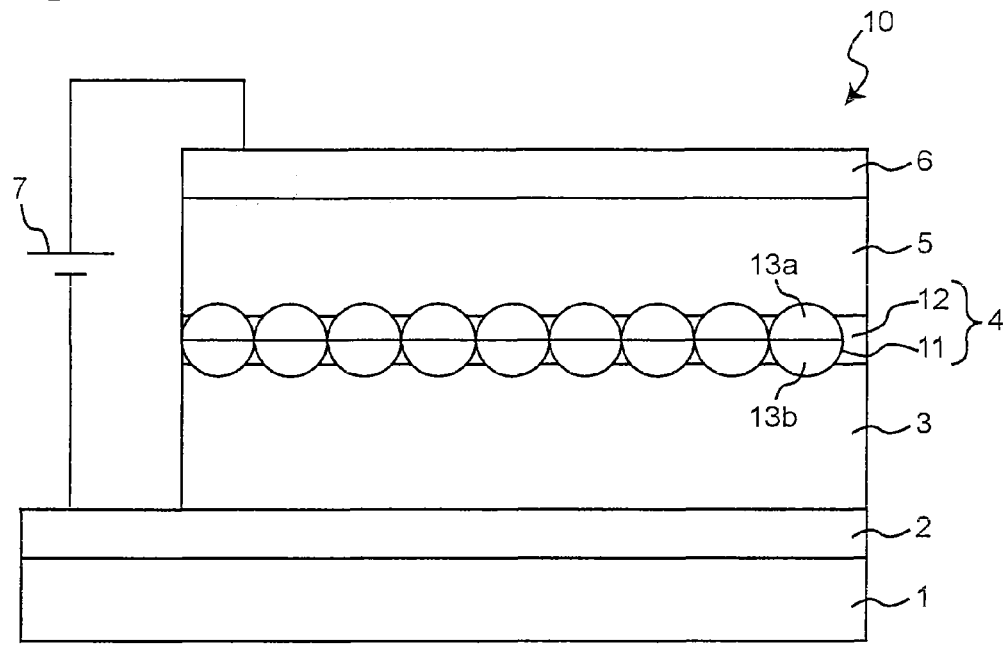
FIG. 1 is a schematic cross sectional view showing a configuration of a light emitting device according to an embodiment 1.

A light emitting device and a method for manufacturing thereof according to an embodiment of the invention will be described with reference to appended drawings. In the drawings, same symbols are assigned to substantially same members and their explanations will be omitted.

First Embodiment

Figure 2:
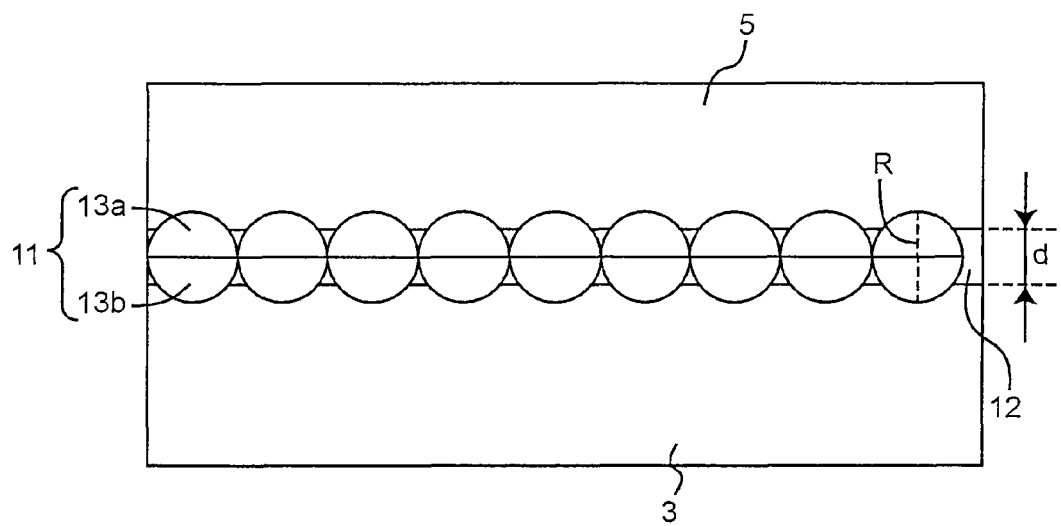
FIG. 2 is a magnified cross sectional view showing the relation of an electron transporting layer, a phosphor layer, and a hole transporting layer of FIG. 1.

FIG. 1 is a schematic cross sectional view showing the configuration of a light emitting device according to a first embodiment of the invention. FIG. 2 is a magnified cross sectional view showing the relation of an electron transporting layer, a phosphor layer, and a hole transporting layer of FIG. 1. The light emitting device 10 has a multilayer structure on a substrate 1 laminated a lower electrode 2, an electron transporting layer 3, a phosphor layer 4 having a single particle layer of semiconductor fine particles 11 containing fine-crystals of a semiconductor, a hole transporting layer 5, and an upper electrode 6 in this order. The electron transporting layer 3 and the hole transporting layer 5 are provided face to face each other at a distance. Further, the phosphor layer 4 has a single particle layer of the semiconductor fine particles 11 sandwiched between the electron transporting layer 3 and the hole transporting layer 5. The semiconductor fine particle 11 has a p-type part 13a and an n-type part 13b, and has a pn-junction inside of the particle. Further, the p-type part 13a of each particle 11 is partially brought into contact with the hole transporting layer 5 and the n-type part 13b of each particle is partially bought into contact with the electron transporting layer 3. The average particle diameter R of the semiconductor fine particles 11 is larger than the average distance d between the electron transporting layer 3 and the hole transporting layer 5 (R>d). The lower electrode 2 is electrically connected with the electron transporting layer 3. The upper electrode 6 is electrically connected with the hole transporting layer 5. The phosphor layer 4 further contains a dielectric material 12 filling voids among the semiconductor fine particles 11. Electric leakage can be suppressed by the dielectric material 12. The dielectric material 12 is not always necessary and for instance, if it is possible to keep the electron transporting layer 3 and the hole transporting layer 5 from each other at a prescribed distance by an outside support or the like, the dielectric material 12 may not be used. The light emitting device 10 can emit light by applying voltage from an electric power source 7 connected between the upper electrode 6 and the lower electrode 2.

In this light emitting device 10, since the phosphor layer 4 can be constituted as a single particle layer of the semiconductor fine particles 11, the device can be produced economically as compared with a device employing a thin film for forming the phosphor layer. Further, since the semiconductor fine particles 11 are sandwiched directly between the electron transporting layer 3 and hole transporting layer 5 without using a binder and electrically connected with the respective layers 3 and 5, the carrier injection efficiency of electrons holes into the semiconductor fine particles 11 can be improved. Accordingly, the light emitting efficiency of the light emitting device 10 can be increased. Further, since the p-type part 13a of each particle is partially brought into contact with the hole transporting layer 5 and the n-type part 13b of each particles is partially brought into contact with the electron transporting layer 3, holes and electrons are efficiently introduced into the inside of the semiconductor fine particles 11. Consequently, light emission can be carried out efficiently in the pn-junction in the inside of the respective particles 11.

Hereinafter, the respective constituent members of the light emitting device 10 will be described.

<Substrate>

As the substrate 1, for instance, a glass substrate, a ceramic substrate, a sapphire substrate, a boron nitride (BN) substrate, an aluminum nitride substrate, a gallium nitride substrate, an aluminum gallium nitride substrate, an indium gallium nitride substrate, a silicon carbide (SiC) substrate, a silicon (Si) substrate, or a metal substrate, or a resin substrate of such as a polycarbonate resin, a polyethylene terephthalate resin, a polyester resin, an epoxy resin, an acrylic resin, an ABS (acrylonitrile-butadiene-styrene copolymer) resin, or the like can be used.

In the case of a constituent of emitting no light from the substrate 1, the above-mentioned light transmitting property is no need and materials having no light transmitting property can be employed.

<Electrode>

As electrodes, there are the lower electrode 2 and the upper electrode 6. They may be a transparent electrode as a electrode in the side where light is emitted and a back plate as the other electrode. Materials and the like for the respective electrodes 2 and 6 are limited in accordance with whether the electrode is in the light emitting side or not. In this connection, both electrodes 2 and 6 may be made to be transparent electrodes. Herein, with respect to the lower electrode 2 and the upper electrode 6, not their arrangement but the cases of using electrodes as a transparent electrode and using electrodes as a back plate will be described.

At first, a case of using an electrode as a transparent electrode will be described. A material of a transparent electrode may be those which have a light transmitting property to emit light generated in the phosphor layer 4 outside and particularly those which have a high transmittance in a visible light region are preferable. Further, as an electrode, those having low resistance are preferable and furthermore, those excellent in adhesiveness to the substrate 1 or the phosphor layer 3 are preferable. Examples particularly preferable as a material for transparent electrodes include, but are not limited to metal oxides mainly ITO ($In_2O_3$ doped with $SnO_2$ and sometimes referred to as indium tin oxide), InZnO, ZnO, $SnO_2$, and the like; metal thin films of Pt, Au, Pd, Ag, Ni, Cu, Al, Ru, Rh, Ir, and the like; or conductive polymers such as polyaniline, polypyrrole, PEDOT/PSS and polythiophen. These transparent electrodes can be formed by a film formation method such as sputtering method, electron beam evaporation method and ion plating method to improve their transparency or decrease a resistivity. They may be subject to a surface treatment such as a plasma treatment to control the resistivity after film formation. The thickness of the transparent electrode is determined by a sheet resistance value needed and visible light transmission.

It is desirable that carrier concentration of the transparent electrode is a range of 1E17 to 1E22 $cm^{-3}$. In addition, it is desirable that volume resistivity of the transparent electrode is 1E-30$\Omega$cm or less and transmission is 75% or more in the wavelength of 380 to 780 nm. Moreover it is preferable that the refractive index of the transparent electrode is 1.85 to 1.95. Further when the thickness of the transparent electrode is 30 nm or less, a membrane having a precise and stable property can be realized.

In addition, a case of using an electrode as a back plate will be described. As a back plate, any of generally known conductive materials can be used. Further, it is preferable that the back plate is excellent in adhesiveness to adjacent layers 3 and 5. As preferable examples, metal oxides such as ITO, InZnO, ZnO, $SnO_2$; metal such as Pt, Au, Pd, Ag, Ni, Cu, Al, Ru, Rh, Ir, Cr, Mo, W, Ta, Nb; laminated structures thereof; conductive polymers such as polyaniline, polypyrrole, PEDOT [poly (3,4-ethylenedioxythiophene)/PSS (polystyrene sulfonic acid); or conductive carbon can be used.

Next, the electron transporting layer 3 and the hole transporting layer 5 will be described. The electron transporting layer 3 and the hole transporting layer 5 are set face to face each other with a distance.

<Electron Transporting Layer>

The electron transporting layer 3 is composed of a nitride of Group IIIB elements to which an n-type impurity such as silicon (Si) is added. The electron transporting layer 3 may have any configuration of a single crystal, a polycrystal, an amorphous, fine particles, an organic substance, a composite thereof, and a laminated membrane.

Further, the electron transporting layer 3 is preferable to have a forbidden band energy higher than that of the semiconductor fine particles 11 including fine-crystals of the semiconductor forming the phosphor layer 4. Accordingly, the electron transporting layer 3 is provided with functions of enclosing carrier against the semiconductor fine particles 11 and as a clad layer. Further, since the wavelength of the light emitted from the semiconductor fine particles 11 becomes longer than the absorption edge wavelength of the electron transporting layer 3 and the light emitted from the semiconductor fine particles 11 can be transmitted without decaying in the electron transporting layer 3, light can be emitted from the substrate 1 and thus the light emitting efficiency can be increased.

<Hole Transporting Layer>

The hole transporting layer 5 in composed of a nitride of Group IIIB elements to which a p-type impurity such as magnesium (Mg) is added. The hole transporting layer 5 may have any configuration of a single crystal, a polycrystal, an amorphous, fine particles, an organic substance, a composite thereof, and a laminated membrane.

Further, the hole transporting layer 5 is preferable to have a forbidden band energy higher than that of the semiconductor fine particles 11 including fine-crystals of the semiconductor composing the phosphor layer 4. Accordingly, similarly to the electron transporting layer 3, the hole transporting layer 5 is provided with functions of enclosing carrier against the semiconductor fine particles 11 and as a clad layer. Further, since the wavelength of the light emitted from the semiconductor fine particles 11 becomes longer than the absorption edge wavelength of the hole transporting layer 5 and the light emitted from the semiconductor fine particles 11 can be transmitted without decaying in the hole transporting layer 5, light can be emitted from the hole transporting layer 5 side and thus the light emitting efficiency can be increased.

<Phosphor Layer>

The phosphor layer 4 has a layer composed of the semiconductor fine particles 11 sandwiched between the electron transporting layer 3 and the hole transporting layer 5. Additionally, as described above, the phosphor layer 4 may further have a dielectric material 12 filling the voids among the semiconductor fine particles 11. By using the dielectric material 12, the current leakage can be suppressed. The layer of the semiconductor fine particles 11 composing the phosphor layer 4 is preferable to be formed as a single particle layer between the electron transporting layer 3 and the hole transporting layer 5. Further, as the semiconductor fine particles 11, those having an average particle diameter R larger than the average surface distance d between the electron transporting layer 3 and the hole transporting layer 5 (relational expression: R>d). Accordingly, the electron transporting layer 3 and the hole transporting layer 5 can be set face to face each other and kept at a prescribed distance and electric connection between the electron transporting layer 3 and the hole transporting layer 5 can be formed through the respective particles of the semiconductor fine particles 11. The average particle diameter R of the semiconductor fine particles 11 may be in a range of 1 to 100 μm.

<Semiconductor Fine Particles>

Figure 4A:
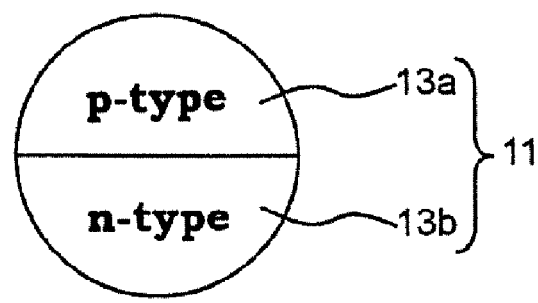
FIG. 4A is a schematic cross sectional view showing pn-junction of semiconductor fine particles and FIG. 4B is a schematic cross sectional view showing a pn-junction of semiconductor fine particles in another example.
Figure 4B:
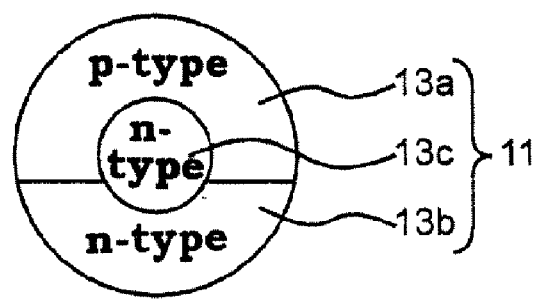

FIGS. 4A and 4B are schematic cross sectional views showing the inner structure of the semiconductor fine particles 11. Each of the semiconductor fine particles 11 includes, as shown in FIG. 4A, a p-type part 13a in the upper part of the particle and an n-type part 13b in the lower part of the particle and has a pn-junction in the interface of the p-type part 13a and the n-type part 13b. Further, as shown in FIG. 4B, semiconductor materials having different doping properties in an inner core and an outer shell may be used to constitute semiconductor fine particles 11 having different doping types in the inner core and a portion of the outer shell. Each of the semiconductor fine particles 11 has an n-type inner core 13c hard to be doped and an outer shell which is easy to be doped and where an original n-type part 13b partially remains and a p-type part 13a is partially formed, and thus an pn-junction is formed in the interface of the p-type doped part 13a of the outer shell and the n-type part 13c of the inner core. In this case, since the n-type part 13b is left in the lower part of the outer shell, the electric connection to the electron transporting layer 3 via the n-type part 13c of the inner core and the n-type part 13b can be guaranteed.

Further, the semiconductor fine particles 11 containing fine-crystals of the semiconductor may be composed of at least partially fine-crystals and for instance, the semiconductor fine particles 11 may further contain other particles other than the semiconductor fine-crystals. Furthermore, fine particles provided with a coating layer on fine-crystals may be contained. Moreover, the semiconductor fine particles 11 themselves may be a single crystal. Herein, fine-crystals are fine particles of a single crystal or a polycrystal. Further, the semiconductor fine particles 11 are enabled to emit light by forbidden band transition (emission attributed to forbidden band transition) or donor-acceptor pair (emission attributed to the donor-acceptor level distance transition). That is, the semiconductor fine particles 11 respectively have functions of forbidden band transition emission or donor-acceptor pair emission.

As the semiconductor fine particles 11, Group III-V compound such as GaAs and InP, oxides and nitrides such as oxides containing at least one kind selected from, for example, zinc (Zn), titanium (Ti), and iron (Fe), and nitrides of Group IIIB elements are preferable. Specific examples include zinc oxide, titanium oxide ($TiO_2$), iron oxide ($Fe_2O_3$ or FeO), zinc oxide-titanium oxide ($ZnO$—$TiO_2$) mixed crystal, zinc oxide-iron oxide ($ZnO$—$Fe_2O_3$) mixed crystal, titanium oxide-iron oxide ($TiO_2$—$Fe_2O_3$) mixed crystal and the like, or gallium nitride, indium nitride, indium gallium nitride mixed crystal, aluminum gallium nitride mixed crystal, indium aluminum gallium nitride mixed crystal and the like.

Further, in the case the semiconductor fine particles 11 is composed to contain fine-crystals of zinc oxide, titanium oxide, or iron oxide, it is preferable that the hole transporting layer 5 is composed by boron nitride, aluminum nitride, gallium nitride, or aluminum gallium nitride mixed crystal. The forbidden band energy of the above-mentioned semiconductor fine particles 11 is 3.2 eV for zinc oxide, 3.0 eV for titanium oxide, 3.1 eV for iron oxide ($Fe_2O_3$), 6.2 eV for boron nitride, 6.1 eV for aluminum nitride, and 3.4 eV for gallium nitride and in the case of a mixed crystal, it is changed in accordance with its composition.

<Dielectric Material>

A dielectric material having a low dielectric constant or a high dielectric constant may be used for the dielectric material 12, if necessary. Metal oxides such as $SiO_2$, $Al_2O_3$, $Y_2O_3$, $BaTa_2O_6$, $Ta_2O_5$; nitrides such as $Si_3N_4$, and oxynitrides such as SiON can be specifically used as a dielectric material having a low dielectric constant. On the other hand, ceramic materials having a perovskite structure are specifically preferable and further $PbNbO_3$, $BaTiO_3$, $SrTiO_3$, $PbTiO_3$, $(Sr, Ca)TiO_3$, and the like can be specifically used as a dielectric material having a high dielectric constant. Current leakage can be suppressed by filling the voids among the semiconductor fine particles 11 with the dielectric material 12.

<Manufacturing Method>

FIGS. 3A to 3I are schematic cross sectional views of respective processes of a method for manufacturing a light emitting device 10 according to the first embodiment.

Figure 3A:
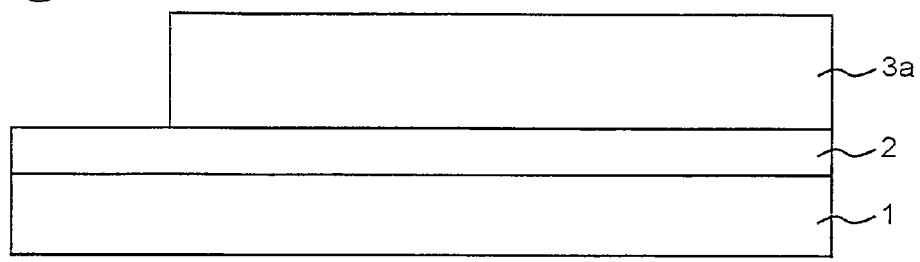
FIG. 3A is a schematic cross sectional view showing one process in a method for manufacturing the light emitting device according to the first embodiment.

(a) At first, the lower electrode 2 is formed on the substrate 1 by patterning and the first electron transporting layer 3a is formed on the patterned lower electrode 2 (FIG. 3A).

Figure 3B:
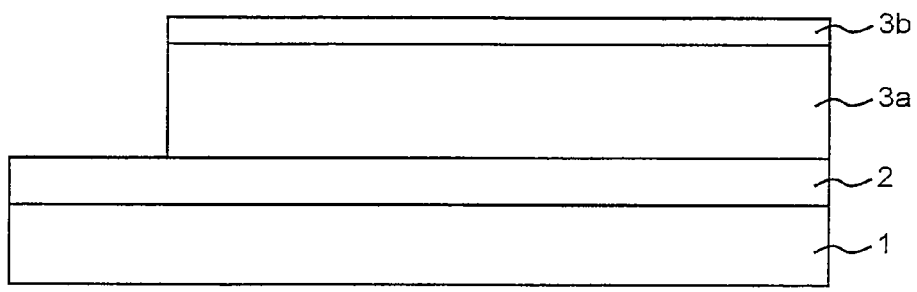
FIG. 3B is a schematic cross sectional view showing one process in a method for manufacturing the light emitting device according to the first embodiment.

(b) Next, a liquid-state second electron transporting layer 3b having fluidity is formed on the first electron transporting layer 3a by application (FIG. 3B). The second electron transporting layer 3b is formed by applying a liquid. The thickness d1 of the second electron transporting layer 3b is made to be thinner than the diameter R of the semiconductor fine particles 11 containing the fine-crystals of the semiconductor to be formed later (relational expression: d1<D). The first electron transporting layer 3a and the second electron transporting layer 3b may be formed using the same materials or different materials. The second electron transporting layer 3b may be formed using not only those having fluidity but also those having adhesiveness for bonding with the semiconductor fine particles 11, or those in which the semiconductor fine particles 11 can be only partially embedded.

Figure 3C:
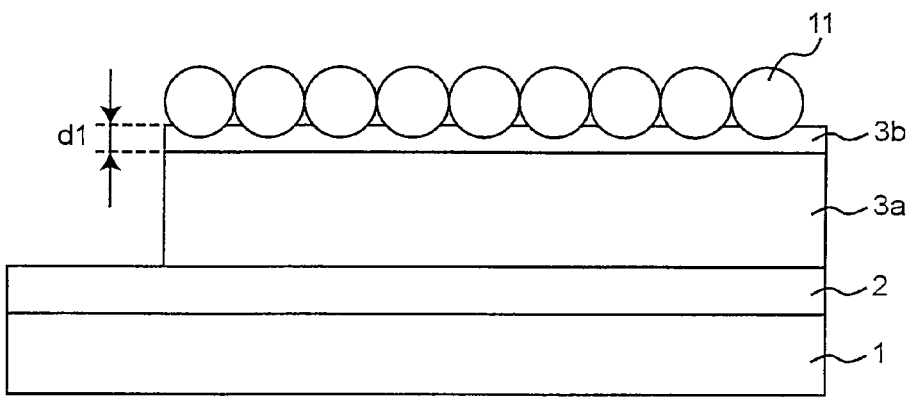
FIG. 3C is a schematic cross sectional view showing one process in a method for manufacturing the light emitting device according to the first embodiment.

(c) Next, the phosphor layer 4 made of a single particle layer of the semiconductor fine particles 11 containing the fine-crystals of a semiconductor is formed on the second electron transporting layer 3b having fluidity (FIG. 3C). As described above, the thickness d1 of the second electron transporting layer 3b is made thinner than the diameter R of the semiconductor fine particles 11. Therefore, the semiconductor fine particles 11 are attached one by one to the second electron transporting layer 3b by spraying the semiconductor fine particles 11 on the second electron transporting layer 3b and excess particles are removed, so that a single particle layer of the semiconductor fine particles 11 can be formed. Accordingly, the electric connection of the semiconductor fine particles 11 and the second electron transporting layer 3b can be made reliable and the dielectric material 12 to be formed thereafter can be prevented from entering between the semiconductor fine particles 11 and the first electron transporting layer 3a. The semiconductor fine particles 11 may be brought into contact with only an upper part of the second electron transporting layer 3b. Alternatively, the semiconductor fine particles 11 may be embedded in the second electron transporting layer 3b and brought into contact with the first electron transporting layer 3a. The first electron transporting layer 3a and the second electron transporting layer 3b constitute the electron transporting layer. Further, the phosphor layer 4 made of the semiconductor fine particles 11 may be formed not only by the spraying method but also, for instance, by application or the like.

Figure 3D:
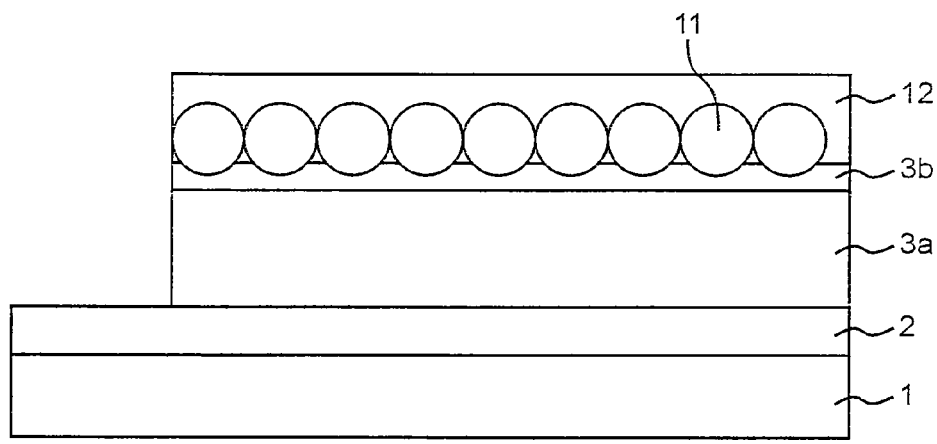
FIG. 3D) is a schematic cross sectional view showing one process in a method for manufacturing the light emitting device according to the first embodiment.

(d) The dielectric film 12 is formed in a manner that the voids among the particles 11 containing fine-crystals of a semiconductor are filled therewith (FIG. 3D).

Figure 3E:
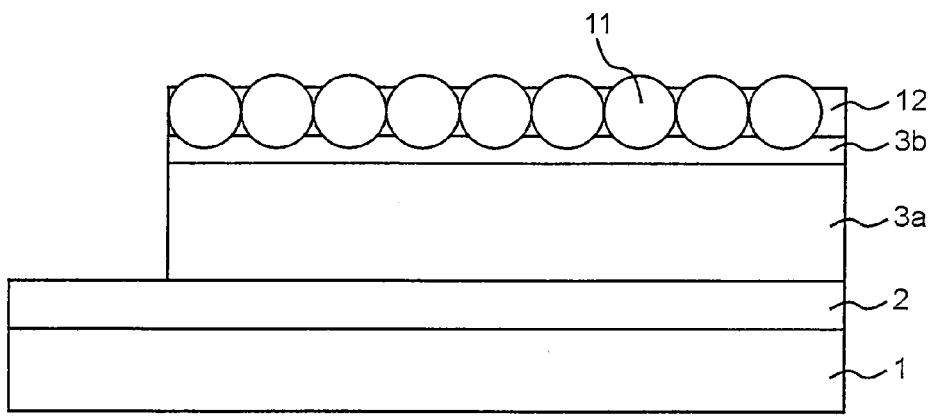
FIG. 3E is a schematic cross sectional view showing one process in a method for manufacturing the light emitting device according to the first embodiment.

(e) The excess dielectric film is removed to expose the upper parts of the particles 11 containing fine-crystals of a semiconductor (FIG. 3E).

Figure 3F:
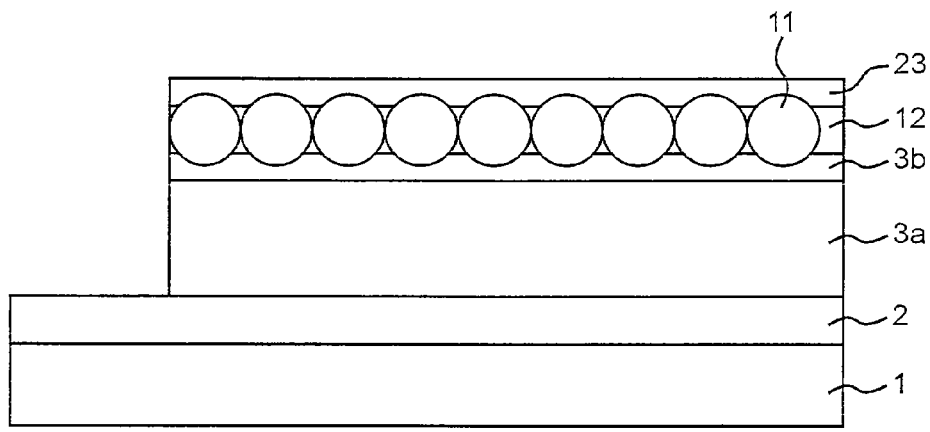
FIG. 3F is a schematic cross sectional view showing one process in a method for manufacturing the light emitting device according to the first embodiment.

(f) A p-type doping material 23 is formed on particles (FIG. 3F). A material such as Mg or the like may be used as the p-type doping material 23.

Figure 3G:
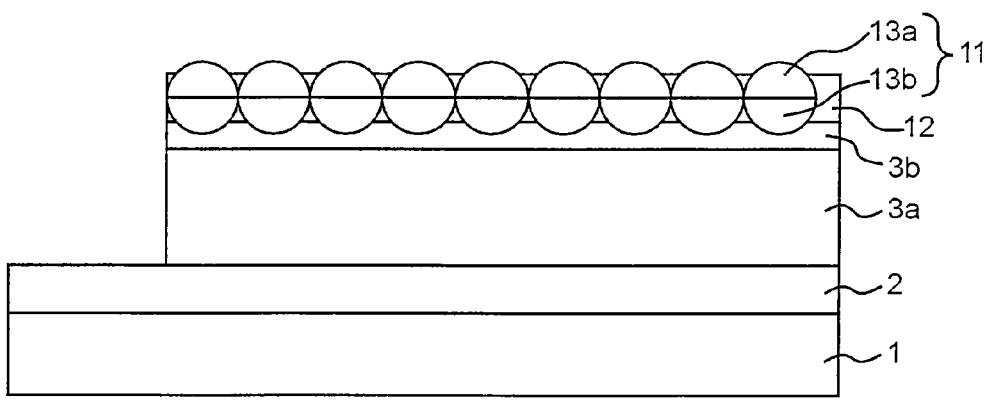
FIG. 3G is a schematic cross sectional view showing one process in a method for manufacturing the light emitting device according to the first embodiment.

(g) A p-type doped part 13a is formed on the upper parts of the particles 11 containing fine-crystals of a semiconductor by a heat treatment and the like and thereafter, unnecessary p-type doping material 23 is removed (FIG. 3G).

Figure 3H:
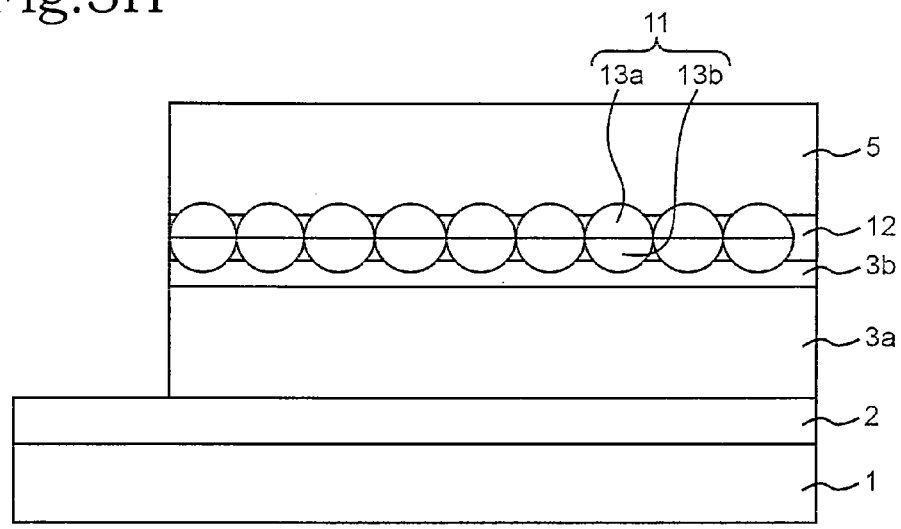
FIG. 3H is a schematic cross sectional view showing one process in a method for manufacturing the light emitting device according to the first embodiment.

(h) The hole transporting layer 5 is formed on the semiconductor fine particles 11 (FIG. 3H).

Figure 3I:
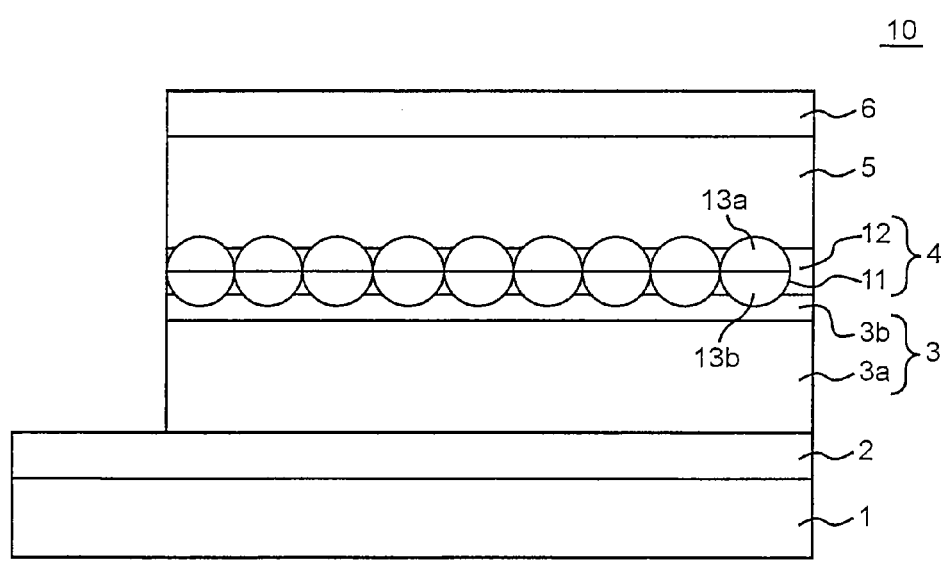
FIG. 3I is a schematic cross sectional view showing one process in a method for manufacturing the light emitting device according to the first embodiment.

(i) The upper electrode 6 is formed on the above-mentioned hole transporting layer 5 (FIG. 3I).

In the processes, the light emitting device 10 is manufactured.

In this manufacturing method, the single particle layer of the semiconductor fine particles 11 is formed on the electron transporting layer 3, however it is not limited to this case, and on the contrary, the single particle layer of the semiconductor fine particles 11 may be provided on the hole transporting layer 5.

Further, in the above-mentioned manufacturing method, the second electron transporting layer 3b with fluidity is employed, however the second electron transporting layer 3b is not necessarily employed. The second electron transporting layer 3b with fluidity is used for adhesive of the semiconductor fine particles 11 to form the single particle layer of the semiconductor fine particles 11 thereon. Therefore, the first electron transporting layer 3a has adhesiveness on its surface, the second electron transporting layer 3b with fluidity is no need to be used. Further, even if the first electron transporting layer 3a has no adhesiveness on its surface, when the single particle layer of the semiconductor fine particles 11 is formed thereafter and electric connection of the semiconductor fine particles 11 and the first electron transporting layer 3a is assured, the second electron transporting layer 3b is no need to be used.

Further, in the above-mentioned manufacturing method, the case of using the semiconductor fine particles 11 shown in FIG. 4A is described, however it is not limited to this case, semiconductor fine particles 11 having the structure shown in FIG. 4B may be employed.

Figure 5A:
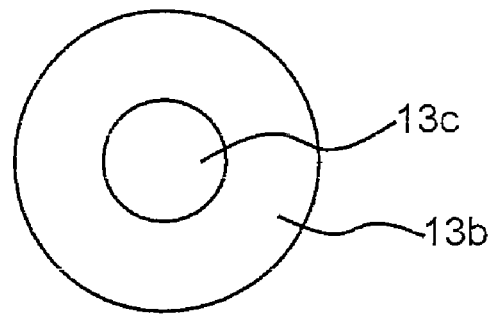
FIGS. 5A to 5C are schematic cross sectional views showing respective processes of a manufacturing method for forming the pn-junction of semiconductor fine particles of FIG. 4B.
Figure 5B:
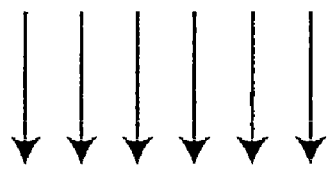
Figure 5B:
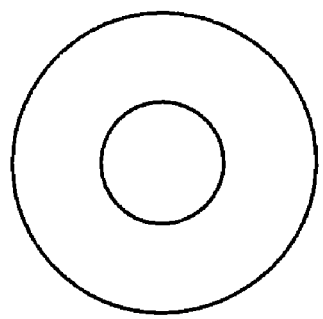
Figure 5C:
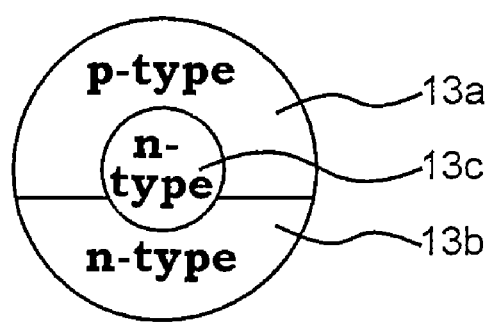

FIGS. 5A to 5C show schematic cross sectional views showing the core process of the manufacturing method forming the semiconductor fine particles 11 shown in FIG. 4B.

(a) The semiconductor fine particles 11 each having an inner core 13c of an n-type semiconductor and an outer shell 13b of an n-type semiconductor are prepared (FIG. 5A). The inner core and outer shell have different doping property and those hard to be doped by p-type doping are used for the inner core and those easy to be doped by p-type doping are used for the outer shell.

(b) For instance, doping is carried out using a p-type doping material 23 in the upper parts of the particles 11 (FIG. 5B).

(c) With respect to the semiconductor fine particles 11, since the inner core is hard to be doped by p-type doping, the n-type part 13c remains as it is in the inner core and since the outer shell is easy to be doped by p-type doping, the n-type part 13b remains in the lower part and at the same time a p-type part 13a is formed in a range from the upper part to the side part (FIG. 5A). In such a manner, a pn-junction is formed in the interface of the p-type doped part 13a in the outer shell and the n-type part 13c of the inner core.

As described, the semiconductor fine particles 11 having the structure shown in FIG. 4B are formed. In this case, since the n-type part 13b remains in the lower part of the outer shell, electric connection of the electron transporting layer 3 via the n-type part 13c of the inner core to the n-type part 13b can be guaranteed.

Second Embodiment

Figure 6:
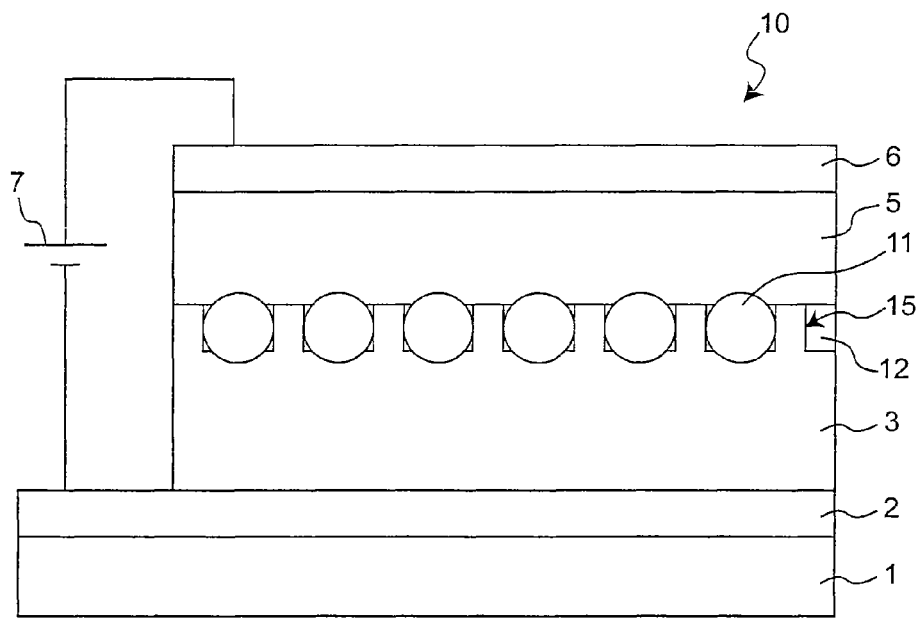
FIG. 6 is a schematic cross sectional view showing a configuration of the light emitting device according to an second embodiment of the invention.

FIG. 6 is a schematic cross sectional view showing a configuration of a light emitting device 10 according to an second embodiment of the invention. The light emitting device 10 has a multilayer structure on a substrate 1 laminated a lower electrode 2, an electron transporting layer 3, a phosphor layer 4 having a single particle layer of semiconductor fine particles 11 containing fine-crystals of a semiconductor and arranged one by one in a groove part 16 formed on the electron transporting layer 3, a hole transporting layer 5, and an upper electrode 6 all of which are layered in this order. The electron transporting layer 3 and the hole transporting layer 5 are provided face to face each other with a distance. Further, the phosphor layer 4 has a single particle layer of the semiconductor fine particles 11 sandwiched between the electron transporting layer 3 and the hole transporting layer 5. The lower electrode 2 is electrically connected with the electron transporting layer 3. The upper electrode 6 is electrically connected with the hole transporting layer 5. The phosphor layer 4 further contains a dielectric material 12 filling voids among the semiconductor fine particles 11. Electric leakage can be suppressed by the dielectric material 12. The dielectric material 12 is not always necessary and for instance, if it is possible to keep the electron transporting layer 3 and the hole transporting layer 5 from each other at a prescribed distance by an outside support or the like, the dielectric material 12 may not be used. The light emitting device 10 can emit light by applying voltage from an electric power source 7 connected between the upper part electrode 6 and the lower part electrode 2.

In this light emitting device 10, since the phosphor layer 4 can be constituted as a single particle layer of the semiconductor fine particles 11 arranged one by one in the groove part 16 formed on the surface of the electron transporting layer 3. The distance of wall parts 15 forming the groove part 16 is adjusted to be slightly larger than the diameter of the semiconductor fine particles 11. Accordingly the semiconductor fine particles 11 are just properly arranged one by one in each groove part. The height of the wall parts 15 is adjusted to be lower than the diameter of the semiconductor fine particles 11. Since the diameter of the semiconductor particles 11 is larger than the wall parts 15, the semiconductor fine particles 11 are projected more above the wall parts 15 and thus the semiconductor fine particles 11 are brought into contact with the hole transporting layer 5.

In the light emitting device 10, since the phosphor layer 4 can be constituted as a single particle layer of the semiconductor fine particles 11, the device 10 can be manufactured at a low cost as compared with a device employing a thin film for forming the phosphor layer. Further, since the semiconductor fine particles 11 are sandwiched directly between the electron transporting layer 3 and the hole transporting layer 5 without using a binder and electrically connected with the respective layers 3 and 5, the carrier injection efficiency of electrons/holes into the semiconductor fine particles 11 can be improved. Consequently, light emitting efficiency of the light emitting device 10 can be increased.

Hereinafter, the respective constituent members of the light emitting device 10 will be described.

In this connection, with respect to the substrate and the electrodes, the same materials as those used for the first embodiment can be used and their explanations are omitted.

The electron transporting layer 3 and the hole transporting layer 5 will be described. The electron transporting layer 3 and the hole transporting layer 5 are provided face to face each other with a distance.

<Electron Transporting Layer>

The electron transporting layer 3 is composed of a nitride of Group IIIB elements to which an n-type impurity such as silicon (Si) is added. The electron transporting layer 3 may have any configuration of a single crystal, a polycrystal, an amorphous, fine particles, an organic substance, a composite thereof, and a laminated membrane.

Further, the electron transporting layer 3 is preferable to have a forbidden band energy higher than that of the semiconductor fine particles 11 including fine-crystals of the semiconductor composing the phosphor layer 4. Accordingly, the electron transporting layer 3 is provided with functions of enclosing carriers against the semiconductor fine particles 11 and as a clad layer. Further, since the wavelength of the light emitted from the semiconductor fine particles 11 becomes longer than the absorption edge wavelength of the electron transporting layer 3 and the light emitted from the semiconductor fine particles 11 can be transmitted without decaying in the electron transporting layer 3, light can be emitted from the substrate 1 and thus the light emitting efficiency can be increased.

Further, among both faces of the electron transporting layer 3, the groove part 16 is formed on the face of the electron transporting layer 3 which faces the hole transporting layer 5. The distance of the wall parts 15 composing the groove part 16 is preferably slightly larger than the diameter of the semiconductor fine particles 11 composing the phosphor layer 4. Accordingly, the semiconductor fine particles 11 are arranged one by one. The height of the wall parts 15 is preferably lower than the diameter of the semiconductor fine particles 11. Accordingly, the semiconductor fine particles 11 are projected more above the wall parts 15 and thus the semiconductor fine particles 11 are brought into contact with the hole transporting layer 5.

<Hole Transporting Layer>

The hole transporting layer 5 is composed of a nitride of Group IIIB elements to which a p-type impurity magnesium (Mg) is added. The hole transporting layer 5 may have any configuration of a single crystal, a polycrystal, an amorphous, fine particles, an organic substance, a composite thereof, and a laminated membrane.

Further, the hole transporting layer 5 is preferable to have a forbidden band energy higher than that of the semiconductor fine particles 11 including fine-crystals of the semiconductor composing the phosphor layer 4. Accordingly, similarly to the electron transporting layer 3, the hole transporting layer 5 is provided with functions of enclosing carrier against the semiconductor fine particles 11 and as a clad layer. Further, since the wavelength of the light emitted from the semiconductor fine particles 11 becomes longer than the absorption edge wavelength of the hole transporting layer 5 and the light emitted from the semiconductor fine particles 11 can be transmitted without decaying in the hole transporting layer 5, light can be emitted from the hole transporting layer 5 and thus the light emitting efficiency can be increased.

<Phosphor Layer>

The phosphor layer 4 has a layer composed of the semiconductor fine particles 11 sandwiched between the electron transporting layer 3 and the hole transporting layer 5. Additionally, as described above, the phosphor layer 4 may further have a dielectric material 12 filling the voids among the semiconductor fine particles 11. By using the dielectric material 12, the current leakage can be suppressed. The layer of the semiconductor fine particles 11 composing the phosphor layer 4 is preferable to be formed as a single particle layer between the electron transporting layer 3 and the hole transporting layer 5. Electric connection between the electron transporting layer 3 and the hole transporting layer 5 can be formed through the respective particles of the semiconductor fine particles 11. The average particle diameter R of the semiconductor fine particles 11 may be in a range of 1 to 100 μm.

<Semiconductor Fine Particles>

The semiconductor fine particles 11 containing fine-crystals of a semiconductor may be composed of at least partially contain fine-crystals and for instance, the semiconductor fine particles 11 may further contain particles other than the semiconductor fine-crystals. Furthermore, fine particles provided with a coating layer on fine-crystals may be contained. Moreover, the semiconductor fine particles 11 themselves may be a single crystal. Herein, fine-crystals are fine particles of a single crystal or a polycrystal. Further, the semiconductor fine particles 11 are enabled to emit light by forbidden band transition (emission attributed to forbidden band transition) or donor-acceptor pair (emission attributed to the donor-acceptor level distance transition). That is, the semiconductor fine particles 11 respectively have functions of forbidden band transition emission or donor-acceptor pair emission.

AS the semiconductor fine particles 11, Group III-V compound semiconductors such as GaAs and InP, oxides and nitrides such as oxides containing at least one kind selected from, for example, zinc (Zn), titanium (Ti), and iron (Fe), and nitrides of Group IIIB elements are preferable. Specific examples include zinc oxide, titanium oxide ($TiO_2$), iron oxide ($Fe_2O_3$ or FeO), zinc oxide-titanium oxide (ZnO—$TiO_2$) mixed crystal, zinc oxide-iron oxide (ZnO—$Fe_2O_3$) mixed crystal, titanium oxide-iron oxide ($TiO_2$—$Fe_2O_3$) mixed crystal and the like, or gallium nitride, indium nitride, indium gallium nitride mixed crystal, aluminum gallium nitride mixed crystal, indium aluminum gallium nitride mixed crystal and the like.

Further, in the case the semiconductor fine particles 11 is composed to contain fine-crystals of zinc oxide, titanium oxide, or iron oxide, it is preferable that the hole transporting layer 5 is composed by boron nitride, aluminum nitride, gallium nitride, or aluminum gallium nitride mixed crystal. The forbidden band energy of the above-mentioned semiconductor fine particles 11 is 3.2 eV for zinc oxide, 3.0 eV for titanium oxide, 3.1 eV for iron oxide ($Fe_2O_3$), 6.2 eV for boron nitride, 6.1 eV for aluminum nitride, and 3.4 eV for gallium nitride and in the case of a mixed crystal, it is changed in accordance with its composition.

<Dielectric Material>

A dielectric material having a low dielectric constant or a high dielectric constant may be used for the dielectric 12 if necessary. Metal oxides such as $SiO_2$, $Al_2O_3$, $Y_2O_3$, $BaTa_2O_6$, $Ta_2O_5$; nitrides such as $Si_3N_4$, and oxynitrides such as SiON can be specifically used as a dielectric material having a low dielectric constant material. On the other hand, ceramic materials having a perovskite structure are specifically preferable and further $PbNbO_3$, $BaTiO_3$, $SrTiO_3$, $PbTiO_3$, $(Sr, Ca)TiO_3$, and the like can be specifically used as a dielectric material having a high dielectric constant. Current leakage can be suppressed by filling the voids among the semiconductor fine particles 11 with the dielectric material 12.

<Manufacturing Method>

FIGS. 7A to 7L are schematic cross sectional views of respective processes of a method for manufacturing a light emitting device 10 according to the second embodiment.

Figure 7A:
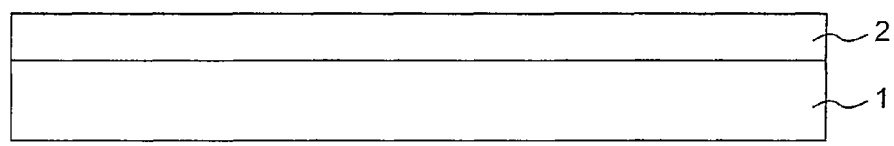
FIG. 7A is a schematic cross sectional view showing one process in a method for manufacturing the light emitting device according to the second embodiment.

(a) At first, the lower electrode 2 is formed on the substrate 1 by patterning (FIG. 7A).

Figure 7B:
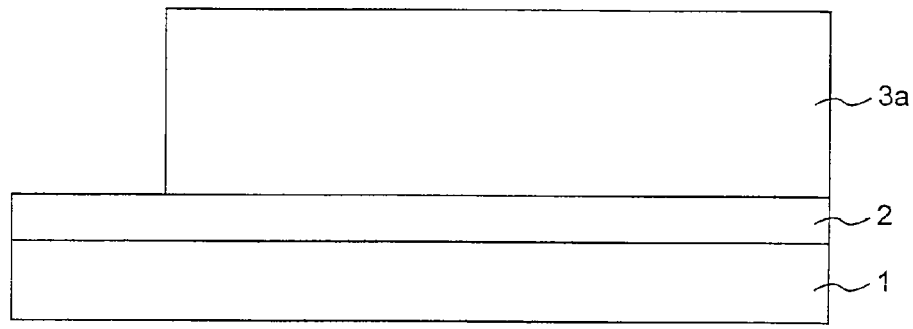
FIG. 7B is a schematic cross sectional view showing one process in a method for manufacturing the light emitting device according to the second embodiment.

(b) Further, the first electron transporting layer 3a is formed on the patterned lower part electrode 2 (FIG. 7B).

Figure 7C:
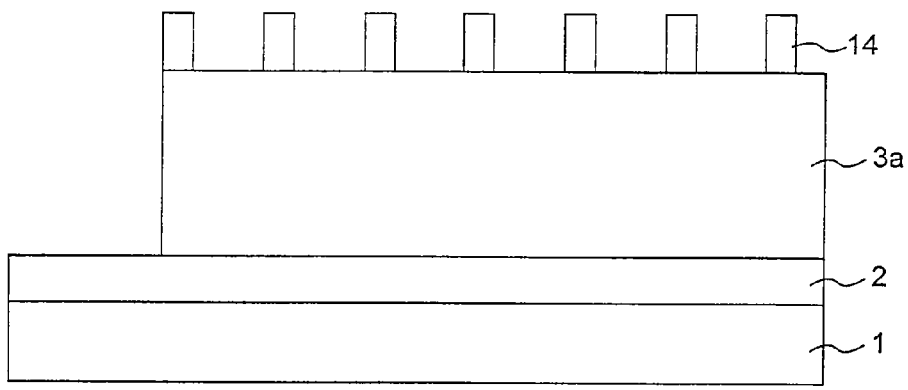
FIG. 7C is a schematic cross sectional view showing one process in a method for manufacturing the light emitting device according to the second embodiment.

(c) Next, resist 14 is patterned on the first electron transporting layer 3a (FIG. 7C).

Figure 7D:
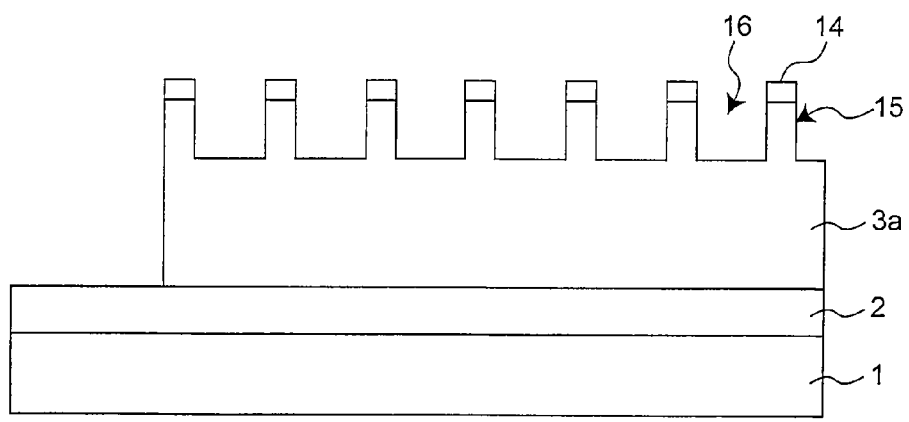
FIG. 7D is a schematic cross sectional view showing one process in a method for manufacturing the light emitting device according to the second embodiment.

(d) Using the patterned resist 14, the first electron transporting layer 3a is processed to have a recessed shape to form the groove 16 sandwiched between wall parts 15 (FIG. 7D). In this case, a method of wet etching, dry etching and the like may be used for the processing method. The distance of wall parts 15 composing the groove part 16 is adjusted to be slightly longer than the diameter of the semiconductor fine particles 11 to be arranged thereafter. Accordingly, the semiconductor fine particles 11 are just properly arranged one by one in each groove part. Further, the height of the wall parts 15 is adjusted to be lower than the diameter of the semiconductor fine particles 11. Since the diameter of the semiconductor particles 11 is larger than the height of the wall parts 15, the semiconductor fine particles 11 are projected more above the wall parts and thus the semiconductor fine particles 11 are brought into contact with the hole transporting layer 5 to be formed thereafter.

Figure 7E:
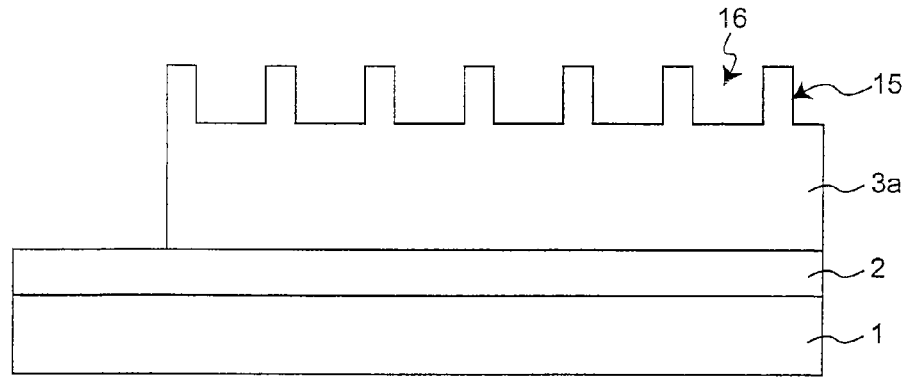
FIG. 7E is a schematic cross sectional view showing one process in a method for manufacturing the light emitting device according to the second embodiment.
Figure 7F:
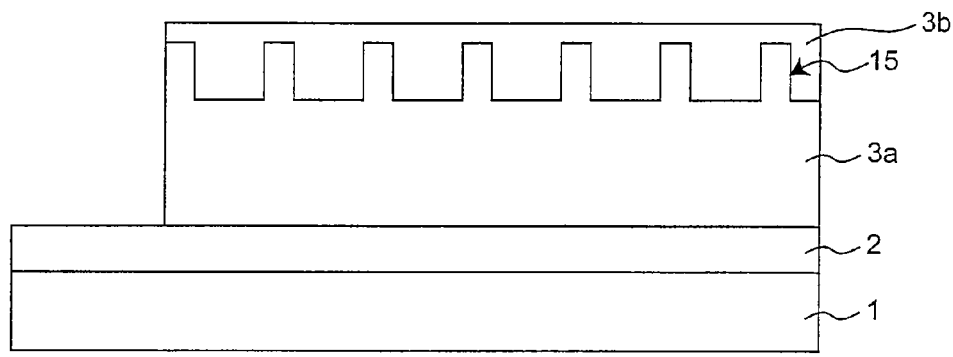
FIG. 7F is a schematic cross sectional view showing one process in a method for manufacturing the light emitting device according to the second embodiment.

(e) Thereafter, the resist 14 is removed (FIG. 7E).

(f) A liquid-state second electron transporting layer 3b having fluidity is formed on the first electron transporting layer 3a by application (FIG. 7F) in a manner that the groove part 15 of the first electron transporting layer 3a is filled therewith. The second electron transporting layer 3b is formed by applying a liquid. The first electron transporting layer 3a and the second electron transporting layer 3b may be formed using the same materials or different materials. The second electron transporting layer 3b may be formed using not only those having fluidity but also those having adhesiveness for bonding with the semiconductor fine particles 11, or those in which the semiconductor fine particles 11 can be only partially embedded.

Figure 7G:
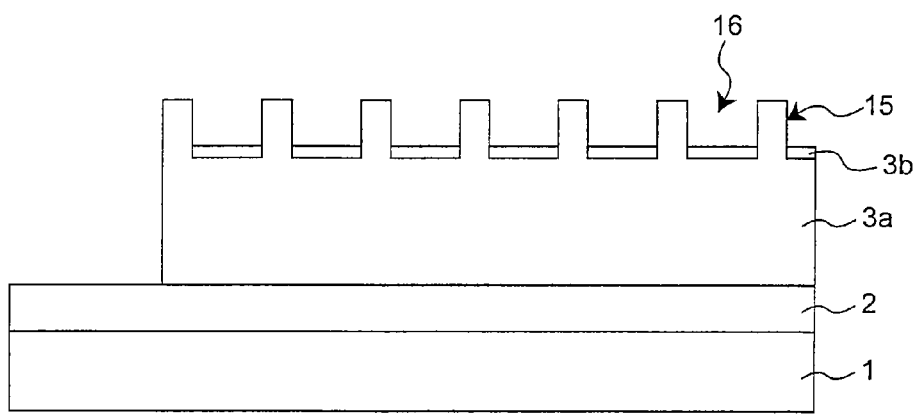
FIG. 7G is a schematic cross sectional view showing one process in a method for manufacturing the light emitting device according to the second embodiment.

(g) Next, the second electron transporting layer 3b is removed so as to be left only in the bottom of the groove part 16 (FIG. 7G).

Figure 7H:
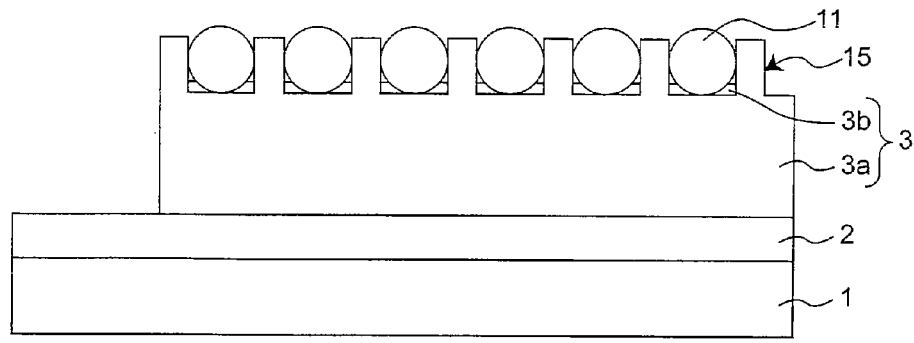
FIG. 7H is a schematic cross sectional view showing one process in a method for manufacturing the light emitting device according to the second embodiment.

(h) Next, the phosphor layer 4 made of a single particle layer of the semiconductor fine particles 11 containing fine-crystals of a semiconductor is formed on the second electron transporting layer 3b having fluidity and formed in the bottom part of the groove part 16 in the first electron transporting layer 3a (FIG. 7H). As described above, since the distance of wall parts 15 composing the groove part 16 provided on the first electron transporting layer 3a is adjusted to be slightly larger than the diameter of the semiconductor fine particles 11, the semiconductor fine particles 11 can be set one by one in the groove part 16. Further, the height of the groove part 16 is adjusted to be lower than the diameter of the semiconductor fine particles 11. Therefore, the semiconductor fine particles 11 are arranged in the groove part 16 one by one by spraying the semiconductor fine particles 11 on the groove part 16 and excess particles are removed, so that a single particle layer of the semiconductor fine particles 11 can be formed. Accordingly, the electric connection of the semiconductor fine particles 11 and the second electron transporting layer 3b can be made reliable and the dielectric material 12 to be formed thereafter can be prevented from entering between the semiconductor fine particles 11 and the first electron transporting layer 3a.

Additionally, the semiconductor fine particles 11 may be brought into contact with only an upper part of the second electron transporting layer 3b. Alternatively, the semiconductor fine particles 11 may be embedded in the second electron transporting layer 3b and brought into contact with the first electron transporting layer 3a. The first electron transporting layer 3a and the second electron transporting layer 3b constitute the electron transporting layer 3. Further, the phosphor layer 4 made of the semiconductor fine particles 11 may be formed not only by the spraying method but also, for instance, by application or the like.

Figure 7I:
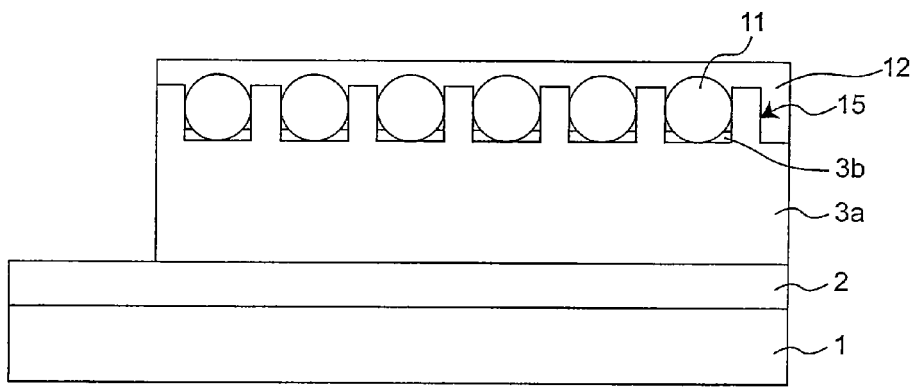
FIG. 7I is a schematic cross sectional view showing one process in a method for manufacturing the light emitting device according to the second embodiment.

(i) The dielectric film 12 is formed in a manner that the voids among the semiconductor fine particles 11 containing fine-crystals of a semiconductor can be filled therewith (FIG. 7I).

Figure 7J:
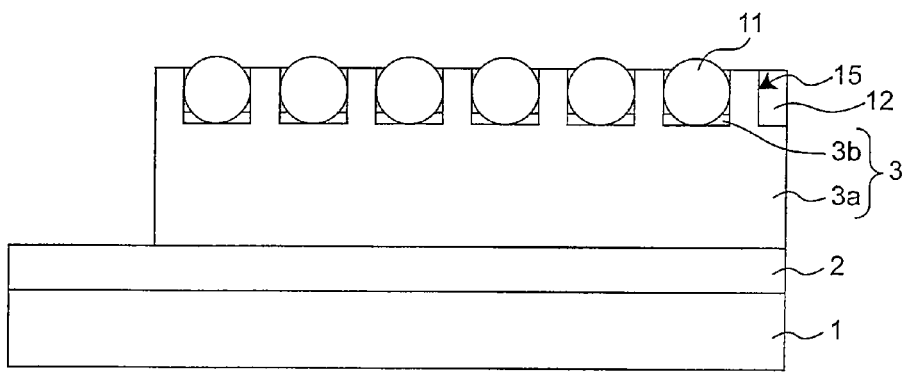
FIG. 7J is a schematic cross sectional view showing one process in a method for manufacturing the light emitting device according to the second embodiment.

(j) The excess dielectric film is removed to expose the upper parts of the particles 11 containing fine-crystals of a semiconductor (FIG. 7J).

Figure 7K:
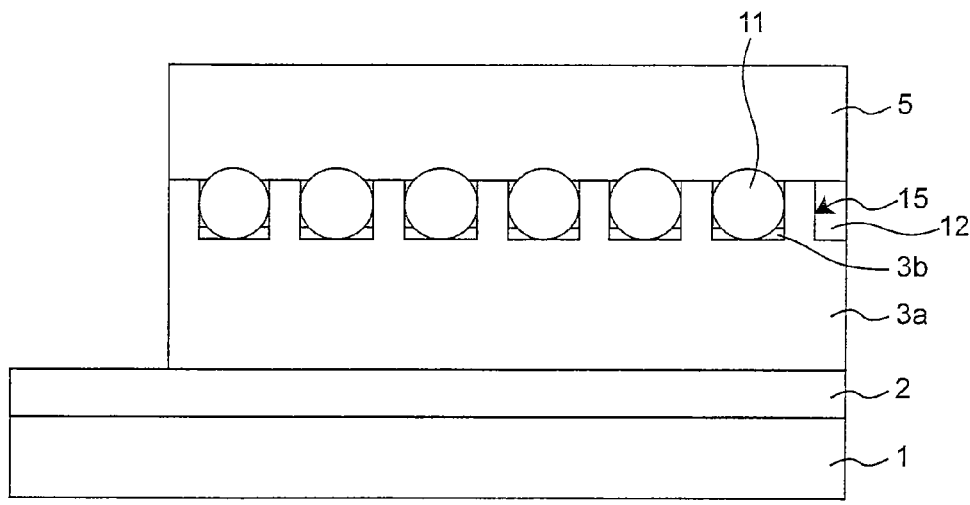
FIG. 7K is a schematic cross sectional view showing one process in a method for manufacturing the light emitting device according to the second embodiment.

(k) The hole transporting layer 5 is formed on the semiconductor fine particles 11 (FIG. 7K).

Figure 7L:
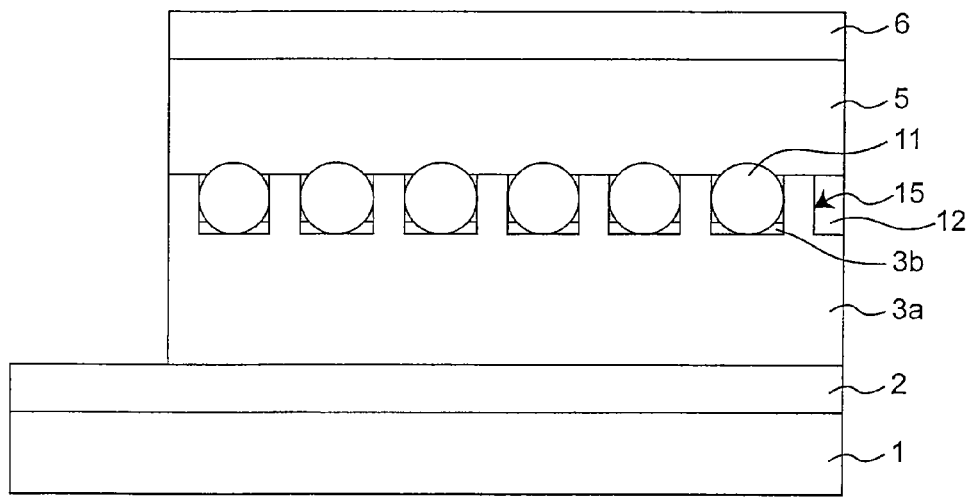
FIG. 7L is a schematic cross sectional view showing one process in a method for manufacturing the light emitting device according to the second embodiment.

(l) The upper electrode 6 is formed on the above-mentioned hole transporting layer 5 (FIG. 7L).

In the processes, the light emitting device 10 is manufactured.

In this manufacturing method, the single particle layer of the semiconductor fine particles 11 is formed in the groove part 16 provided on the first electron transporting layer 3a, however it is not limited to this case, and on the contrary, the groove part may be formed in the surface of the hole transporting layer 5 and the single particle layer of the semiconductor fine particles 11 may be formed on the groove part of the hole transporting layer 5.

Further, in the above-mentioned manufacturing method, the second electron transporting layer 3b with fluidity is employed, however the second electron transporting layer 3b is not necessarily employed. The second electron transporting layer 3b with fluidity is used for adhesion of the semiconductor fine particles 11 to form the single particle layer of the semiconductor fine particles 11 thereon. Therefore, the first electron transporting layer 3a has adhesiveness on its surface, the second electron transporting layer 3b with fluidity is no need to be used. Further, even if the first electron transporting layer 3a has no adhesiveness on its surface, when the single particle layer of the semiconductor fine particles 11 is formed thereafter and electric connection of the semiconductor fine particles 11 and the first electron transporting layer 3a is assured, the second electron transporting layer 3b is no need to be used.

Third Embodiment

Figure 8A:
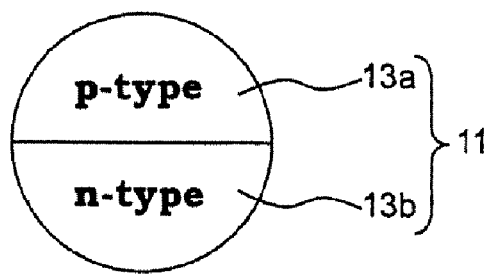
FIG. 8A is a schematic cross sectional view showing pn-junction of semiconductor fine particles of a light emitting device according to a third embodiment and FIG. 8B is a schematic cross sectional view showing a pn-junction of semiconductor fine particles in another example.
Figure 8B:
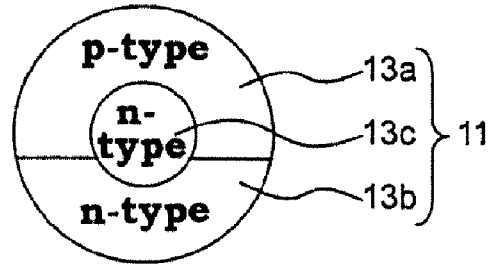

As compared with the light emitting device according to the second embodiment, the light emitting device according to the third embodiment of the invention is different in the inner structure of the semiconductor fine particles 11. As shown in FIGS. 8A and 8B, the semiconductor fine particles 11 have a p-type part 13a and an n-type part 13b, and have a pn-junction insides of the particles. Further, the p-type part 13a of each particle 11 is partially brought into contact with the hole transporting layer 5 and the n-type part 13b is partially brought into contact with the electron transporting layer 3. Accordingly, the holes and electrons are efficiently introduced into the insides of the semiconductor fine particles 11 and light is efficiently emitted in the pn-junction in the inside of each particle 11.

FIGS. 8A and 8B are schematic cross sectional views showing the inner structure of the semiconductor fine particles 11 according to the third embodiment. As shown in FIG. 8A, the semiconductor fine particles 11 have a p-type part 13a in the upper part of the particle and an n-type part 13b in the lower part of the particle and have a pn-junction in the interface of the p-type part 13a and n-type part 13b. Further, as shown in FIG. 8B, semiconductor materials having different doping properties in an inner core and an outer shell may be used to constitute semiconductor fine particles 11 having different doping types in the inner core and a portion of the outer shell. Each of the semiconductor fine particles 11 has an n-type inner core 13c hard to be doped and an outer shell which is easy to be doped and where an original n-type part 13b partially remains and a p-type part 13a is partially formed and thus a pn-junction is formed in the interface of the p-type doped part 13a of the outer shell and the n-type part 13c of the inner core. In this case, since the n-type part 13b is left in the lower part of the outer shell, the electric connection to the electron transporting layer 3 via the n-type part 13c of the inner core and the n-type part 13b can be guaranteed.

As compared with the method for manufacturing the light emitting device of the second embodiment, the method for manufacturing the light emitting device according to the third embodiment is different at a point that the method further includes the process of forming a pn-junction in the semiconductor fine particle 11. The process of forming the pn-junction in the inside of the semiconductor fine particle 11 can actually be carried out by, for instance, the following two steps.

(1) A p-type doping material 23 is formed on particles. A material, e.g., Mg, may be used as the p-type doping material 23.

(2) The p-type part 13a is formed in the upper part of each particle 11 including fine-crystals of a semiconductor by a heat treatment and the like, and thereafter, the unnecessary excess p-type doping material 23 is removed.

The pn-junction can be formed inside of each semiconductor fine particle 11 by performing the above-mentioned two steps. The above-mentioned two steps are only an example and the process should not be limited to the example.

In the above-mentioned manufacturing method, the case of using the semiconductor fine particles 11 shown in FIG. 8A is described, however, the method should not be limited to this example and semiconductor fine particles 11 having the structure shown in FIG. 8B can be formed.

Figure 9A:
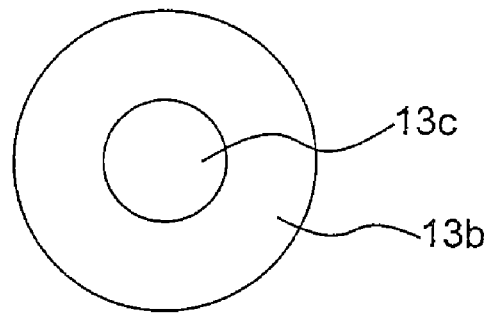
FIGS. 9A to 9C are schematic cross sectional views showing respective processes of a manufacturing method for forming the pn-junction of semiconductor fine particles of FIG. 8B.
Figure 9B:
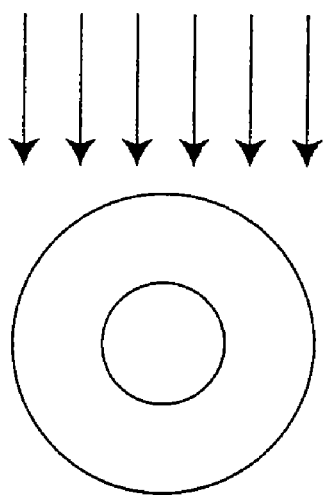
Figure 9C:
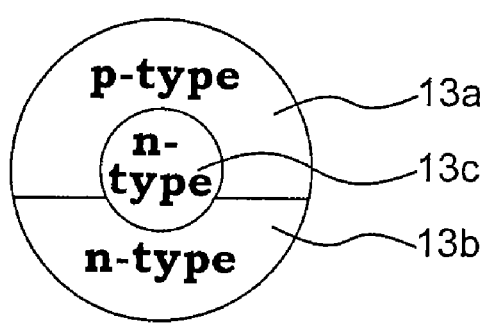

FIGS. 9A to 9C are schematic cross sectional views showing the core process of the manufacturing method forming the semiconductor fine particles 11 shown in FIG. 8B.

(a) The semiconductor fine particles 11 each having an inner core 13c of an n-type semiconductor and an outer shell 13b of an n-type semiconductor are prepared (FIG. 9A). The inner core and outer shell have different doping property and those hard to be doped by p-type doping are used for the inner core and those easy to be doped by p-type doping are used for the outer shell.

(b) For instance, doping is carried out using a p-type doping material 23 in the upper parts of the particles 11 (FIG. 9B).

(c) With respect to the semiconductor fine particles 11, since the inner core is hard to be doped by p-type doping, the n-type part 13c remains as it is in the inner core and since the outer shell is easy to be doped by p-type doping, the n-type part 13b remains in the lower part and at the same time a p-type part 13a is formed in a range from the upper part to the side part (FIG. 9A). In such a manner, a pn-junction is formed in the interface of the p-type doped part 13a in the outer shell and the n-type part 13c of the inner core.

As described, the semiconductor fine particles 11 having the structure shown in FIG. 8B are formed. In this case, since the n-type part 13b remains in the lower part of the outer shell, electric connection of the electron transporting layer 3 via the n-type part 13c of the inner core to the n-type part 13b can be guaranteed.

According to the invention, the light emitting device capable of carrying out surface light emission with a large surface area can be manufactured at a low cost.

As described above, while the invention has been described in detail with reference to specific preferred embodiments, the invention is not limited to the embodiments and various modifications and applications may occur to those skilled in the art without departing from the true spirit and scope of the invention as defined by the appended claims.

What is claimed is:

1. A method for manufacturing a light emitting device comprising:

forming a first electron transporting layer on a substrate;

forming a second electron transporting layer having fluidity on the first electron transporting layer;

forming a single particle layer of n-type semiconductor fine particles on the second electron transporting layer by arranging by one semiconductor fine particle in depth direction;

doping a p-type dopant on each n-type semiconductor fine particle to form a p-type part at an upper part while maintaining an n-type part at a lower part wherein each semiconductor fine particle has a p-type part at the upper part and n-type part at the lower part, and a pn-junction are formed between the p-type part and the n-type part in each semiconductor fine particle;

forming a hole transporting layer on the p-type part of each semiconductor fine particle of the single particle layer, wherein the p-type part of each semiconductor fine particle is partially contacted with the hole transporting layer, while the n-type part of each semiconductor fine particle is partially contacted with the second electron transporting layer; and forming a second electrode on the hole transporting layer.

2. The method for manufacturing a light emitting device according to claim 1, further comprising embedding a dielectric material in voids among the semiconductor fine particles and removing the dielectric material to expose upper parts of the semiconductor fine particles.

3. The method for manufacturing a light emitting device according to claim 1, wherein the semiconductor fine particles include GaN.

* * * * *